(12) United States Patent
Chih

(10) Patent No.: US 7,119,604 B2
(45) Date of Patent: Oct. 10, 2006

(54) BACK-BIAS VOLTAGE REGULATOR HAVING TEMPERATURE AND PROCESS VARIATION COMPENSATION AND RELATED METHOD OF REGULATING A BACK-BIAS VOLTAGE

(75) Inventor: Yue-Der Chih, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 118 days.

(21) Appl. No.: 10/871,292

(22) Filed: Jun. 17, 2004

(65) Prior Publication Data
US 2005/0280463 A1   Dec. 22, 2005

(51) Int. Cl.
*H03K 3/01* (2006.01)
(52) U.S. Cl. ..................... 327/534; 327/540
(58) Field of Classification Search ............. 327/534, 327/535, 536, 537, 538, 540, 541, 543
See application file for complete search history.

(56) References Cited

U.S. PATENT DOCUMENTS

| | | | |
|---|---|---|---|
| 5,029,282 A | 7/1991 | Ito | |
| 5,097,303 A | 3/1992 | Taguchi | |
| RE34,797 E | 11/1994 | Sato et al. | |
| 5,783,934 A | 7/1998 | Tran | |
| 6,614,705 B1 | 9/2003 | Foss et al. | |
| 6,741,118 B1 * | 5/2004 | Uchikoba et al. | 327/541 |
| 6,906,576 B1 * | 6/2005 | Sivero et al. | 327/536 |

OTHER PUBLICATIONS

Tanaka et al., A Precise On-Chip Voltage Generator for a Giga-Scale DRAM with a Negative Word-Line Scheme; 1998 Symposium on VLSI Circuits Digest of Technical Papers, pp. 94-95.

* cited by examiner

*Primary Examiner*—Jeffrey Zweizig
(74) *Attorney, Agent, or Firm*—Baker & McKenzie LLP

(57) ABSTRACT

Disclosed herein is a back-bias voltage regulator circuit for regulating a back-bias voltage used to control leakage current in at least one transistor within a primary circuit. In one embodiment, the back-bias voltage regulator circuit includes a voltage divider circuit configured to receive a back-bias voltage from a charge pump, and to generate a divided voltage signal by dividing the back-bias voltage based on a ratio of resistances of resistive elements within the voltage divider. In addition, the regulator circuit includes an output circuit configured to receive the back-bias voltage from the charge pump and having an output node for outputting the back-bias voltage, as well as a reference voltage circuit configured to generate a reference voltage signal based on a threshold voltage of the at least one transistor in the primary circuit. Also in such an embodiment, the regulator circuit includes a comparison circuit configured to compare the divided voltage signal to the reference voltage signal and to operate the output circuit to regulate the back-bias voltage level based on the comparison. Also disclosed is a related method of regulating a back-bias voltage to control leakage current in at least one transistor within a primary circuit.

22 Claims, 6 Drawing Sheets

BACK-BIAS VOLTAGE REGULATOR HAVING TEMPERATURE AND PROCESS VARIATION COMPENSATION AND RELATED METHOD OF REGULATING A BACK-BIAS VOLTAGE

TECHNICAL FIELD

Disclosed embodiments herein relate generally to generating and regulating back-bias voltage, and more particularly to a back-bias voltage regulator circuit for regulating a back-bias voltage in response to temperature and/or process variations.

BACKGROUND

In recent years, there continues to be dramatic density increases in integrated circuit technology for semiconductor chips. For example, the minimum feature size of lithography, such as the size of MOSFETs, has presently been reduced to one micrometer and below. Many applications implemented on modern semiconductor integrated circuit (IC) chips require accurate operation, which becomes increasingly difficult to provide as chip density continues to increase.

Among the specific problems that can occur in electrical circuits, particularly semiconductor circuitry, is leakage current through the transistors. As is well known, as the threshold voltage in a metal-oxide-semiconductor field-effect transistor (MOSFET) decreases, leakage current typically increases. Among the more common causes for a decrease in desired threshold voltage is an increase in temperature or process variations during the manufacturing process for the MOSFET that resulted in a lower threshold voltage than intended or desired.

To combat such leakage current, a back-bias voltage is typically applied to the well of the MOSFET to help increase the potential difference across the MOSFET, and therefore increase the threshold voltage of the device. Early approaches implemented a string of diodes coupled to the MOSFETs to decrease the leakage current, but this approach suffered several disadvantages. A primary disadvantage was a reduced back-bias voltage as the threshold voltage continued to decrease, which in the end resulted in more leakage current. Another popular conventional approach is to employ a back-bias voltage generator along with a back-bias voltage regulator circuit. Unfortunately, even this approach suffers from disadvantages, particularly the use of a fixed reference voltage on which the regulation of the back-bias voltage is based. Such a fixed reference voltage, and thus a fixed back-bias voltage, prevents the circuit from tracking any changes in the MOSFETs, even those that directly affect the amount of leakage current such as temperature and process variations. Accordingly, what is needed is a back-bias voltage regulator circuit that does not suffer from these disadvantages.

BRIEF SUMMARY

Disclosed herein is a back-bias voltage regulator circuit for regulating a back-bias voltage used to control leakage current in at least one transistor within a primary circuit. In one embodiment, the back-bias voltage regulator circuit includes a voltage divider circuit configured to receive a back-bias voltage from a charge pump, and to generate a divided voltage signal by dividing the back-bias voltage based on a ratio of resistances of resistive elements within the voltage divider. In addition, the regulator circuit includes an output circuit configured to receive the back-bias voltage from the charge pump and having an output node for outputting the back-bias voltage. The regulator circuit also includes a reference voltage circuit configured to generate a reference voltage signal based on a threshold voltage of the at least one transistor in the primary circuit. Also in such an embodiment, the regulator circuit includes a comparison circuit configured to compare the divided voltage signal to the reference voltage signal and to operate the output circuit to regulate the back-bias voltage level based on the comparison.

Also disclosed is a method of regulating a back-bias voltage to control leakage current in at least one transistor within a primary circuit. In one embodiment, the method includes generating a divided voltage signal by dividing a back-bias voltage received from a charge pump by a ratio of resistances of resistive elements arranged in voltage divider circuit. The method also includes generating a reference voltage signal based on a threshold voltage of the at least one transistor in the primary circuit. In addition, this embodiment of the method further includes comparing the divided voltage signal to the reference voltage signal and operating an output circuit configured to receive the back-bias voltage in order to regulate the back-bias voltage level based on the comparing.

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION OF PREFERRED EMBODIMENTS

Figure 1:
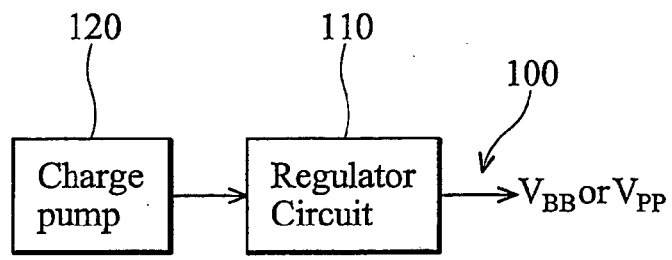
FIG. 1 illustrates a general block diagram of a typical environment for a back-bias voltage regulator circuit.

Referring initially to FIG. 1, illustrated is a general block diagram 100 of a typical environment for a conventional back-bias voltage regulator circuit or a back-bias voltage regulator circuit 110 of the type disclosed herein. As illustrated, such voltage regulators 110 output a back-bias voltage ($V_{PP}/V_{BB}$), typically based on an input from a charge pump 120. More specifically, the back-bias voltage $V_{PP}/V_{BB}$ is employed to reduce the current leakage typically present across metal-oxide-semiconductor (MOS) devices employed at an operating voltage that is too low or too high, as shown in FIG. 2.

Figure 2:
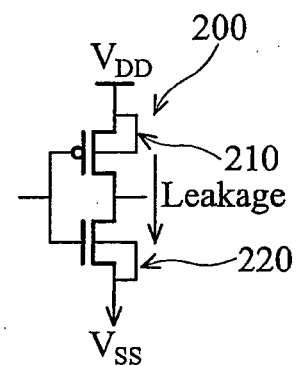
FIG. 2 a conventional CMOS circuit in need of a back-bias voltage provided by a regulator circuit, such as the one illustrated in FIG. 1.

Looking briefly at FIG. 2, illustrated is a conventional CMOS primary circuit 200 in need of back-bias voltage provided by a regulator circuit, such as the one illustrated in FIG. 1. The CMOS design is provided by a PMOS device 210 and an NMOS device 220. In this conventional layout, no back-bias voltage is applied to the circuit 200 during operation. As a result, a leakage current is often present across the MOSFETs in the CMOS circuit 200, particularly in sub-micron processing. Leakage is typically prevalent during low-voltage operation because the threshold voltages of the MOSFETs 210, 220 are usually low during low-voltage operation. In addition, even during high voltage operation, the higher applied voltage can more often overcome even higher threshold voltages, and thus leakage may still be pervasive. Of course, in either case, the presence of leakage across the MOSFETs 210, 220 detrimentally affects the function of the CMOS circuit 200 along with any larger circuit using the voltage output from the regulator, as mentioned above.

Figure 3:
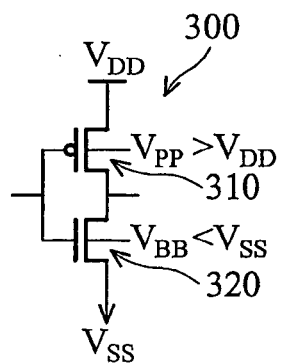
FIG. 3 illustrates a conventional CMOS circuit 300 similar to that shown in FIG. 2, but now including back-bias voltage to help reduce current leakage.

Looking now at FIG. 3, illustrated is a conventional CMOS circuit 300 similar to that shown in FIG. 2, but now including back-bias voltage to help reduce current leakage. Specifically, in this popular approach, the N-well of the PMOS device 310 is connected to a back-bias voltage $V_{PP}$ higher than the voltage of the power supply ($V_{DD}$), while the P-well of the NMOS device 320 is connected a back-bias voltage $V_{BB}$ lower than ground ($V_{SS}$). In accordance with known principles, as the back-bias voltage $V_{PP}/V_{BB}$ is applied as shown, the threshold voltages $V_T$ of the MOSFETs 310, 320 is increased. As a result, the leakage current across these devices 310, 320 is reduced.

More specifically, the back-bias voltage reduces the junction capacitance formed by the P-N junction between the source-drain regions of the N-channel MOSFETs and the semiconductor substrate, and by the P-N junction between the semiconductor wiring regions and the semiconductor substrate. Since the parasitic capacitance, which limits the operating speed, is thus reduced, the integrated circuit can operate at a higher speed. The back-bias voltage $V_{BB}$ increases the threshold voltage of the parasitic MOSFET and prevents the operation of the parasitic MOSFET.

Unfortunately, as mentioned above, even with the approach illustrated in FIG. 3, the back-bias voltage $V_{PP}/V_{BB}$ is typically regulated at a fixed level. This is due to the use of a fixed reference voltage signal on which the regulation of the back-bias voltage $V_{PP}/V_{BB}$ is based. When the back-bias voltage $V_{PP}/V_{BB}$ is provided at a fixed level, it cannot track variations in the threshold voltages $V_T$ of the MOSFETs 310, 320 in the voltage regulator circuit 300 that may occur due to, for example, temperature changes or process variations that can affect threshold voltage $V_T$ (collectively, process voltage and temperature (PVT)). In higher voltage applications (e.g., >1 volt), this may be less of a problem since threshold voltages $V_T$ remain higher (of course if the applied voltage $V_{DD}$ is too high, leakage may still be a problem). However, in low voltage applications (e.g., 1 volt or less), the leakage current results in a lower threshold voltage $V_T$, making the problem worse. The disclosed approach provides a back-bias voltage capable of tracking variations in leakage current/threshold voltage in both high and low voltage applications, and due to both temperature and process variations.

Figure 4A:
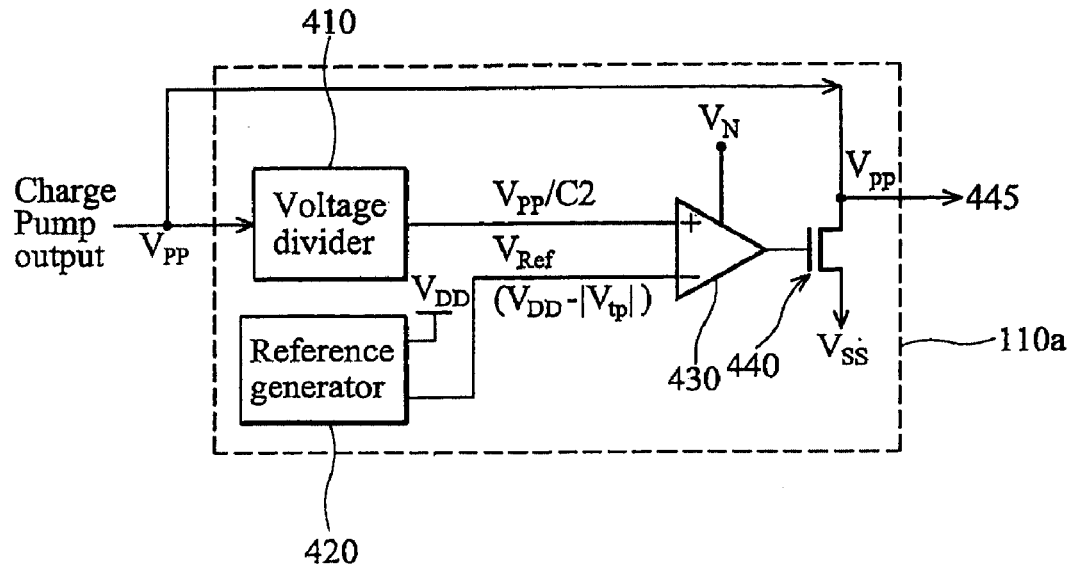
FIG. 4A illustrates one embodiment of a voltage regulator circuit 110a for use in an NMOS application.
Figure 4B:
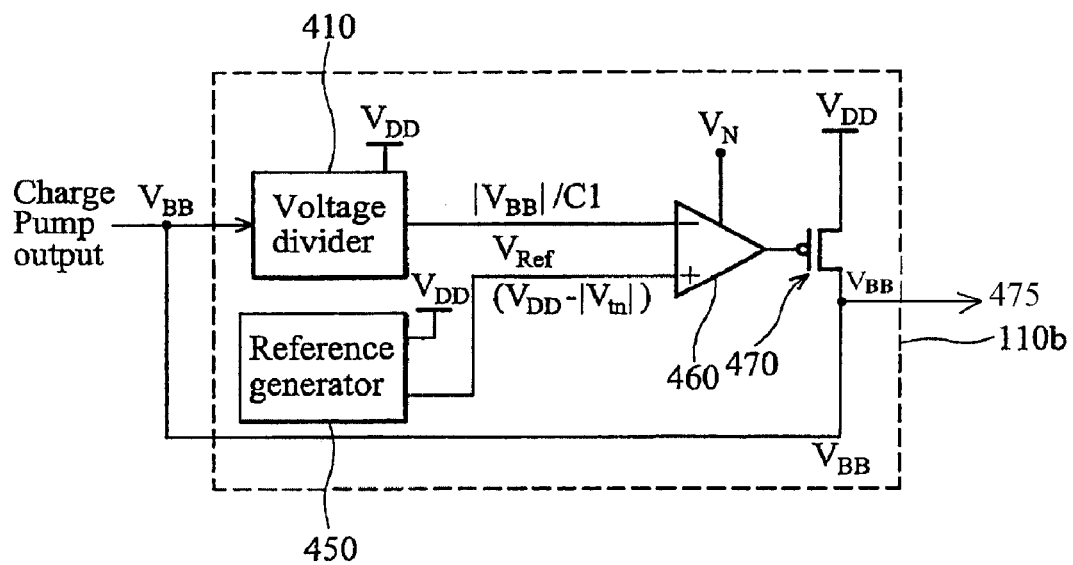
FIG. 4B illustrates one embodiment of a voltage regulator circuit 110b for use in a PMOS application

Turning to FIGS. 4A and 4B, illustrated are exemplary embodiments of voltage regulator schemes for use in the voltage regulator 110 of FIG. 1 and constructed according to the principles disclosed herein. FIG. 4A illustrates a voltage regulator circuit 110a for use in an NMOS application, while FIG. 4B illustrates a voltage regulator circuit 110b for use in a PMOS application. In typical circuits, CMOS devices are used (i.e., both PMOS and NMOS) so a back-bias voltage regulator constructed according to the principles disclosed herein will typically include both illustrated regulator circuits 110a and 110b.

In FIG. 4A, for NMOS applications the back-bias voltage regulator circuit 110a includes a voltage divider circuit 410 configured to receive a back-bias voltage $V_{PP}$ from a charge pump. The voltage divider 410 generates a divided voltage signal by dividing the back-bias voltage $V_{PP}$ using the resistance (C2) in the voltage divider 410. The resistance C2 is simply a ratio of the resistive elements in the voltage divider 410, which may simply be resistors having the divided voltage signal tapped from between them. Of course, other types of resistive elements may also be employed, as may additional components in the voltage divider circuitry 410. Once generated, the divided voltage signal ($V_{PP}/C2$) is input to a non-inverting input of a comparison circuit, which in an advantageous embodiment is a differential amplifier 430.

Also included in FIG. 4A is a reference voltage generator circuit 420 configured to generate a reference voltage ($V_{Ref}$) based on the applied voltage $V_{DD}$ and the (positive) threshold voltage ($V_{tp}$) of transistors found in a primary circuit (not illustrated). The transistors in the primary circuit are typically suffering from current leakages, and thus benefit from the application of the back-bias voltage $V_{PP}$ generated by the charge pump and regulated by the illustrated regulator circuit 110a (see FIG. 3). The reference voltage $V_{Ref}$ is derived by subtracting the absolute value of threshold voltage $|V_{tp}|$ from the applied voltage $V_{DD}$. This reference voltage is then input to an inverting input of the differential amplifier 430. The differential amplifier 430, which is independently powered ($V_N$) compares the divided voltage signal to the reference voltage $V_{Ref}$ and produces an output signal based on this comparison. The output signal is transmitted to the gate of an NMOS device (MOSFET) 440 for regulating the back-bias voltage $V_{PP}$, as disclosed herein.

The NMOS device 440 represents an output circuit for the regulator circuit 110a, which is configured to also receive the back-bias voltage $V_{PP}$ from the charge pump in order to regulate this voltage $V_{PP}$. The back-bias voltage $V_{PP}$ may be tapped at an output 445 and applied to the wells of other MOSFETs in the primary circuit for controlling leakage currents therethrough, as described above with reference to FIG. 3. Of course, any number of MOSFETs, or even other devices, may be employed in such an output circuit.

In operation, as the differential amplifier 430 compares the divided voltage signal to the reference voltage $V_{Ref}$, when the back-bias voltage $V_{PP}$ increases so too does the divided voltage signal. When the divided voltage signal exceeds the reference voltage $V_{Ref}$, the output of the differential amplifier 430 goes high, and thus the charge on the gate of the NMOS device 440 also goes high. Since an NMOS device 440 is employed in the output circuit, the current through the NMOS device when the charge on its gate is low is either very low or zero. As a result, the back-bias voltage $V_{PP}$ tapped at the output 445 remains unchanged from the charge pump. However, when the differential amplifier 430 goes high and thus the charge on the gate of the NMOS device 440 goes high, the NMOS device 440 begins drawing current and therefore begins to draw down the back-bias voltage $V_{PP}$. As a result, the back-bias voltage $V_{PP}$ tapped at the output 445 is lowered. As the back-bias voltage $V_{PP}$ decreases it will eventually become low enough to decrease the divided voltage signal back below the reference voltage $V_{Ref}$, thus causing the output of the differential amplifier 430 to go low again.

Looking at FIG. 4B, PMOS applications the back-bias voltage regulator circuit 110b again includes a voltage divider circuit 410 configured to receive a back-bias voltage $V_{BB}$ from a charge pump. The voltage divider 410 generates a divided voltage signal by dividing the back-bias voltage $V_{BB}$ using the resistance (C1) in the voltage divider 410. In addition, the voltage divider circuit 410 also includes an inverter so that the absolute value of the divided voltage signal is used. As with the circuit in FIG. 4A, the resistance C1 is simply a ratio of the resistive elements in the voltage divider 410, which may simply be resistors having the divided voltage signal tapped from between them. Once generated, the divided voltage signal ($V_{BB}$/C1) is input to an inverting input of a comparison circuit, which in the illustrated embodiment is again a differential amplifier 460.

Also included in FIG. 4B is a reference voltage generator circuit 450 configured to generate a reference voltage $V_{Ref}$ based off of the applied voltage $V_{DD}$ and the (negative) threshold voltage ($V_{tn}$) of transistors found in a primary circuit (not illustrated), as discussed above. The reference voltage $V_{Ref}$ is derived by subtracting the absolute value of this threshold voltage $|V_{tn}|$ from the applied voltage $V_{DD}$. This reference voltage $V_{Ref}$ is then input to a non-inverting input of the differential amplifier 460. The differential amplifier 460, which is again independently powered ($V_N$) compares the divided voltage signal to the reference voltage $V_{Ref}$ and produces an output signal based on this comparison. The output signal is transmitted to the gate of a PMOS device (MOSFET) 470 for regulating the back-bias voltage $V_{BB}$.

The PMOS device 470 represents an output circuit for the regulator circuit 110b, which is coupled to the back-bias voltage $V_{BB}$ of the charge pump, as well as the applied voltage $V_{DD}$, in order to regulate the back-bias voltage $V_{BB}$. The back-bias voltage $V_{BB}$ is tapped at an output 475 and applied to the wells of other MOSFETs in the primary circuit for controlling leakage currents therethrough, as discussed above. Of course, as before, any number of MOSFETs, or even other devices, may be employed in such an output circuit.

In operation, as the differential amplifier 470 compares the divided voltage signal to the reference voltage $V_{Ref}$, when the back-bias voltage $V_{BB}$ decreases so too does the divided voltage signal. When the divided voltage signal is higher than the reference voltage $V_{Ref}$, the output of the differential amplifier 460 remains low, and thus the charge on the gate of the PMOS device 470 also remains low. Hence, the back-bias voltage $V_{BB}$ tapped at the output 475 remains unchanged. Since a PMOS device 470 is employed in this embodiment of the output circuit, current flows through the PMOS device 470 when the charge on its gate is low, while current flow drops when the charge on the gate is high. Thus, when the divided voltage signal drops below the reference voltage $V_{Ref}$, the output of the differential amplifier 460 goes high causing the charge on the gate of the PMOS device 470 to go high. As a result, the current flow through the PMOS device 470 slows or stops, which causes an increase in the potential difference across the PMOS device 470. As a result, the back-bias voltage $V_{BB}$ increases. As the back-bias voltage $V_{BB}$ increases it will eventually become high enough to increase the divided voltage signal above the reference voltage $V_{Ref}$, thus causing the output of the differential amplifier 460 to go low again.

By employing regulating circuitry employing the principles disclosed herein, the back-bias voltage used to control leakage current through other transistors may be more accurately regulated than with conventional circuit designs. More specifically, the disclosed principles provide for regulating the back-bias voltage in spite of temperature and/or process variations found in the circuitry. This is accomplished by comparing a back-bias voltage (via the divided voltage signal) to a reference voltage to regulate the back-bias voltage, but where the reference voltage is variable based on variations in the threshold voltage(s) of the transistor(s) in the primary circuit configured to receive the back-bias voltage. Thus, the amount of back-bias voltage is regulated in accordance with variations in threshold voltage, rather than being a fixed voltage. For example, as transistors in need of back-bias voltage are operated, their temperature typically increases over time. As a result, their threshold voltages typically begin to decrease with this increase in temperature and thus a different amount of back-bias voltage is typically preferred.

However, in conventional back-bias voltage regulator circuits, the back-bias voltage is kept at a substantially stable level, thus not providing for the proper amount of back-bias voltage in the face of such temperature (and thus threshold voltage) changes. In contrast, a back-bias voltage regulator circuit constructed as described herein provides for regulation of the back-bias voltage based in part on such changes in threshold voltage due to temperature changes, thus providing the proper amount of back-bias voltage when needed. Similarly, process variations during the formation of such transistors can result in differing threshold voltages (e.g., fast corner or slow corner devices). Thus, as before, such differences in threshold voltage typically result in the need for a different back-bias voltage than the conventional circuit may be constructed to provide. A back-bias voltage regulator circuit constructed as described herein can therefore provide a back-bias voltage regulated in part on such differences in threshold voltage, and thus provide the proper amount of back-bias voltage accordingly.

Figure 5:
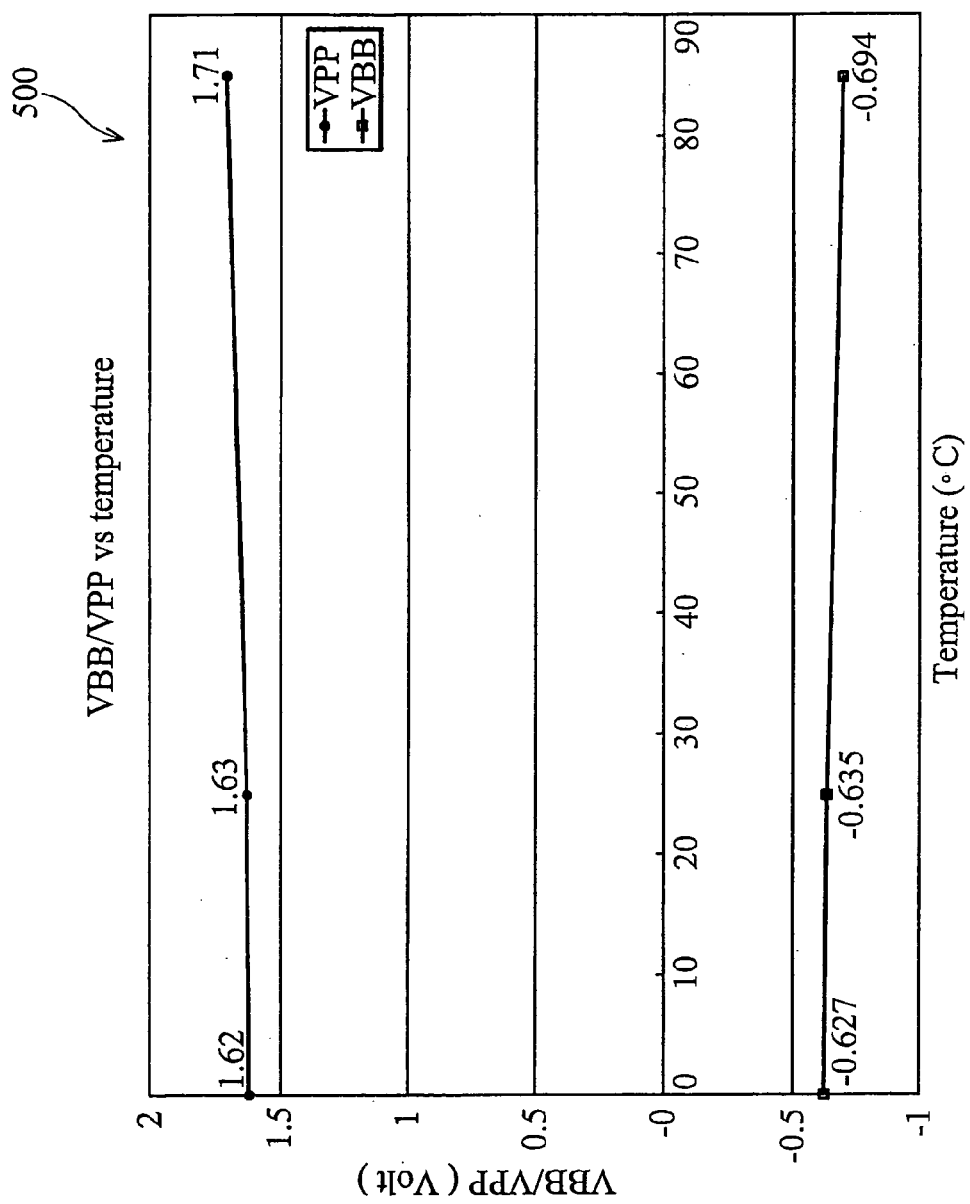
FIG. 5 illustrates a simulation of actual back-bias voltage measurements taken from a circuit constructed as disclosed herein across a large temperature fluctuation.

Turning now to FIG. 5, illustrated is a simulation 500 of actual back-bias voltage measurements ($V_{PP}$ and $V_{BB}$) taken from a circuit constructed as disclosed herein across a large temperature fluctuation. As illustrated, the temperature change ranged from about 0° C. to about 90° C. Beneficially, a circuit constructed according to the principles disclosed herein provided a back-bias voltage $V_{PP}$ that increased along with the temperature increase. Specifically, as may be seen, this back-bias voltage $V_{PP}$ increased from about 1.62V to about 1.71V across the corresponding range of temperature increase. Similarly, another circuit constructed based on the disclosed principles provided back-bias voltage $V_{BB}$ that beneficially decreased from about −0.627V to about −0.694V across the same corresponding range of temperatures. These results confirm the advantageous ability to compensate a back-bias voltage for temperature variations that is provided by regulator circuitry designed using the disclosed principles.

Figure 6:
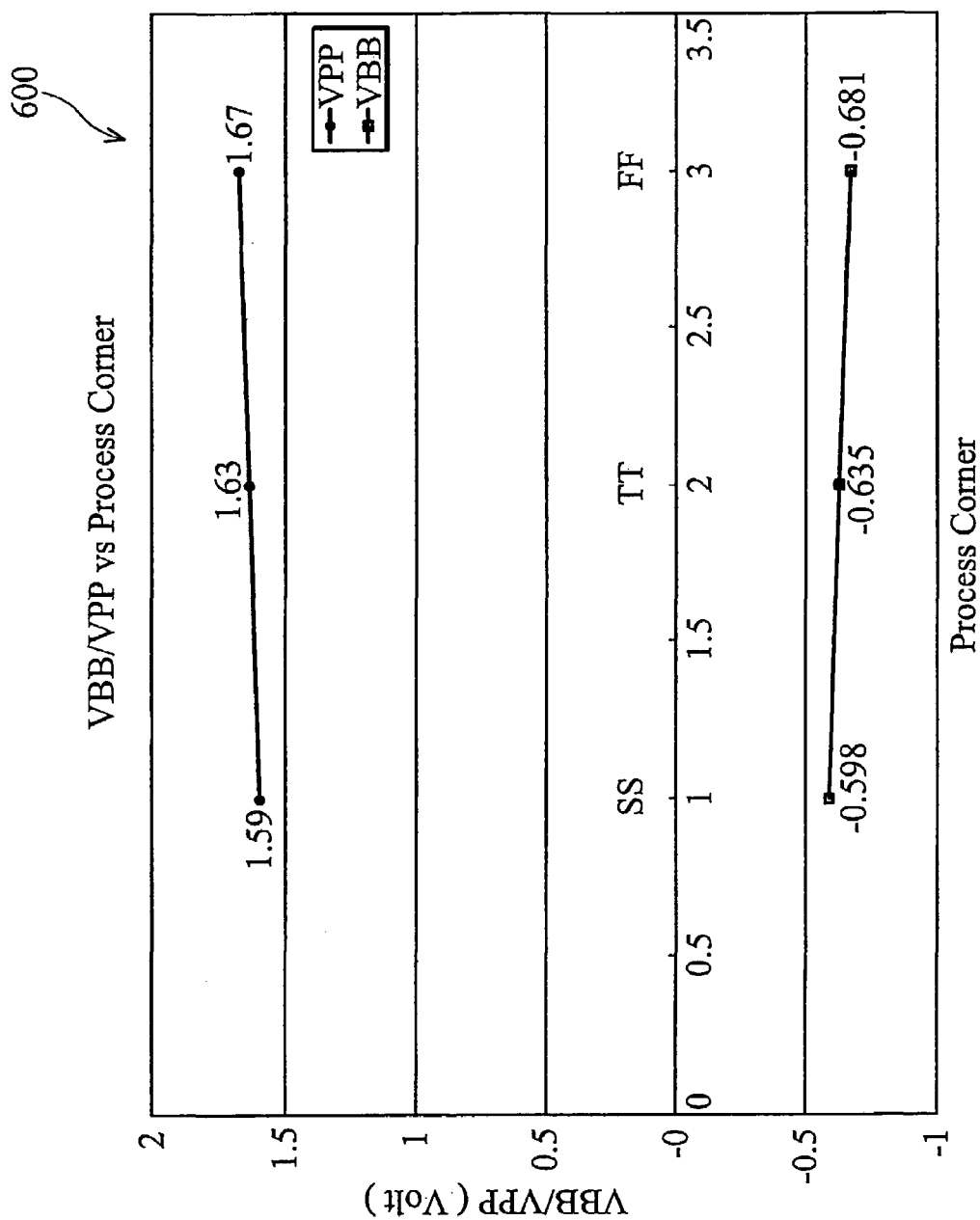
FIG. 6 illustrates a simulation of actual back-bias voltage measurements taken from a circuit constructed as disclosed herein across variations in process corners.

Referring now to FIG. 6, illustrated is a simulation 600 of actual back-bias voltage measurements taken from a circuit constructed as disclosed herein across variations in process corners. As illustrated, several process corners were evaluated with regulator circuits as disclosed herein. Embodiments of the disclosed regulator circuits provided a back-bias voltage $V_{PP}$ that increased along with an increase in process corner. Specifically, the back-bias voltage $V_{PP}$ provided was about 1.59V at the slow corner (SS=1), about 1.63V at the typical corner (TT=2), and about 1.67V at the fast corner (FF=3). Similarly, a PMOS-based regulator circuit provided back-bias voltage $V_{BB}$ that decreased as the process corner increased. Specifically, the back-bias voltage $V_{PP}$ provided was about −0.598V at the slow corner (SS=1), about −0.635V at the typical corner (TT=2), and about −0.681V at the fast corner (FF=3). These results confirm the advantageous ability to compensate a back-bias voltage for process variations that is provided by regulator circuitry designed using the disclosed principles.

Figure 7:
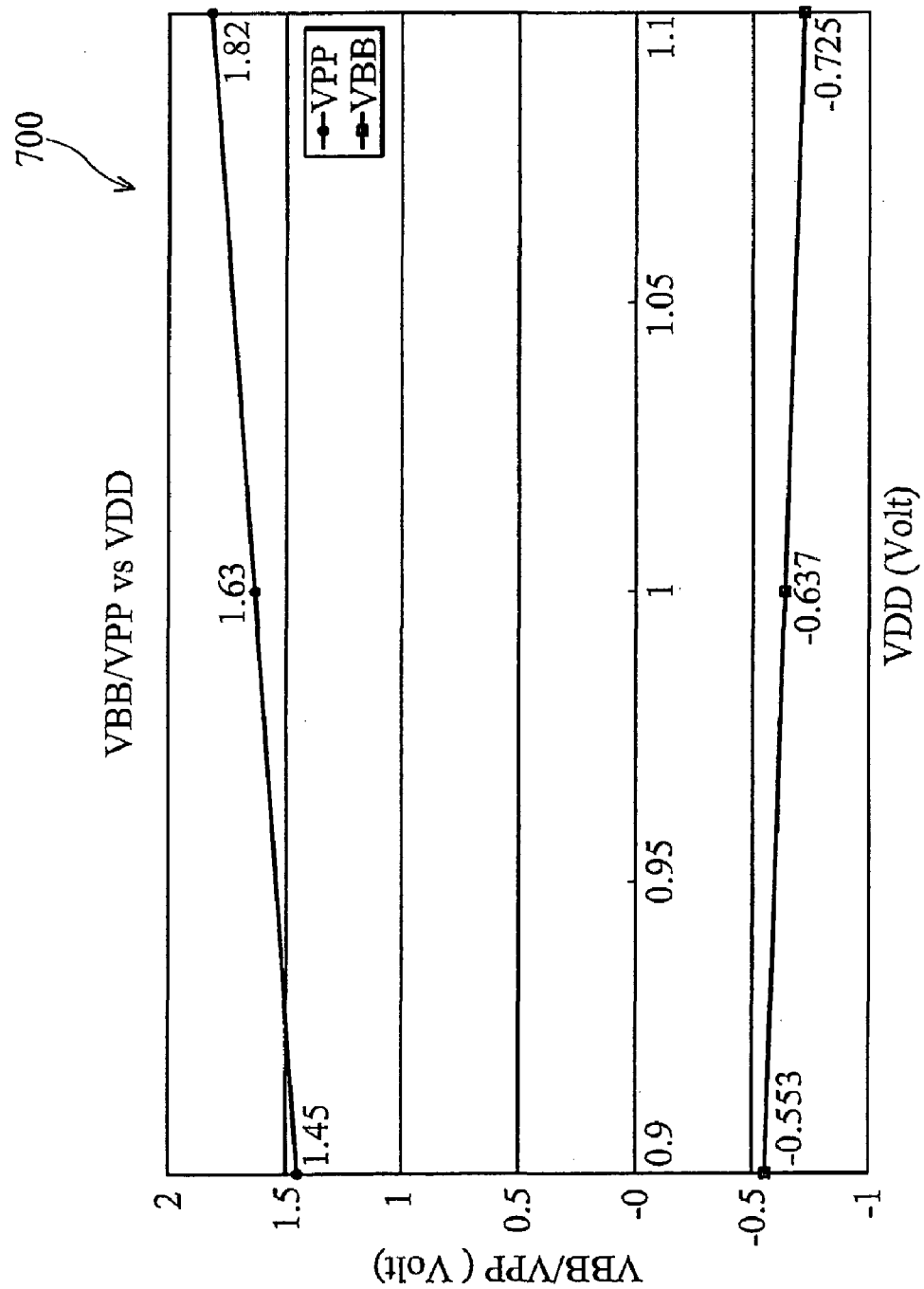
FIG. 7 illustrates a simulation of actual back-bias voltage measurements taken from a circuit constructed as disclosed herein across a variation in supply voltage.

Looking now at FIG. 7, illustrated is a simulation 700 of actual back-bias voltage measurements taken from a circuit constructed as disclosed herein across a variation in supply voltage. This simulation illustrates the increase (and decrease) of the back-bias voltages ($V_{PP}$, $V_{BB}$) across an increasing applied voltage $V_{DD}$. As discussed above, the reference voltage $V_{Ref}$ is generated by subtracting a threshold voltage $V_{tp/tn}$ from the applied voltage $V_{DD}$. Thus, as the threshold voltage $V_{tp/tn}$ decreases (e.g., with temperature increases), the reference voltage $V_{Ref}$ changes accordingly. As seen in FIG. 7, an increase in the applied voltage $V_{DD}$ may also cause a change in the reference voltage $V_{Ref}$, independent of a change in threshold voltage $V_{tp/tn}$. As a result, the back-bias voltage $V_{PP}/V_{BB}$ increases/decreases accordingly. However, if a dependence on the applied voltage $V_{DD}$ is not desired, other embodiments of the disclosed regulator circuitry may employ a bandgap voltage of the transistors in the primary circuit, as discussed below with reference to FIGS. 8A and 8B.

Figure 8A:
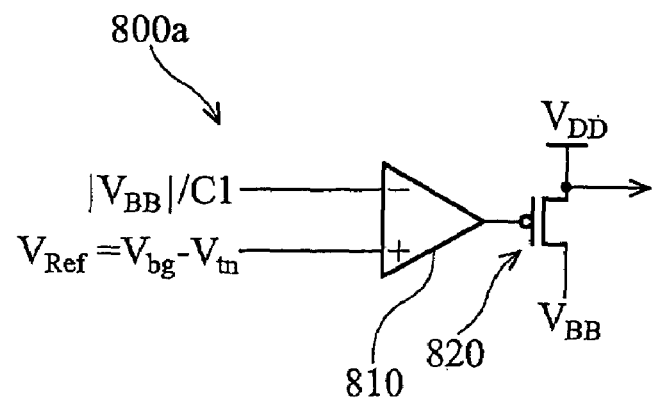
FIG. 8A illustrates a PMOS-based back-bias voltage regulator circuit employing a bandgap voltage over a supply voltage for generating the reference voltage.
Figure 8B:
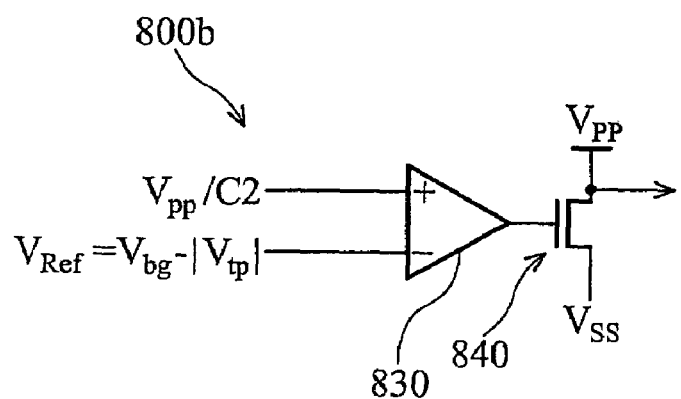
FIG. 8B illustrates an NMOS-based back-bias voltage regulator circuit employing a bandgap voltage over a supply voltage for generating the reference voltage.

Turning to FIGS. 8A and 8B, illustrated are a PMOS-based back-bias voltage regulator circuit 800a, as well as an NMOS-based regulator circuit 800b. Both regulator circuits 800a, 800b operate similar to their counterparts discussed above in FIGS. 4A and 4B. For example, the PMOS-based circuit 800a includes a differential amplifier 810 configured to receive a divided voltage signal from a voltage divider, as well as a reference voltage signal $V_{Ref}$. Then, also as before, the output of the differential amplifier 810 operates an output circuit having a PMOS device 820 in order to regulate the back-bias voltage $V_{BB}$. In this embodiment, however, the reference voltage $V_{Ref}$ is derived by subtracting the threshold voltage $V_{tn}$ from the bandgap voltage $V_{bg}$, rather than from the applied voltage $V_{DD}$. As a result, the regulation of the back-bias voltage $V_{BB}$ is independent of the applied voltage $V_{DD}$. For more information on bandgap voltages, see Horowitz et al., *The Art of Electronics*, p. 195, Cambridge University Press 1980, which is incorporated herein by reference in its entirety for all purposes.

Similarly, the NMOS-based regulator circuit 800b again includes a differential amplifier 830, whose output is used to operate an output circuit having an NMOS device 840 in order to regulate the back-bias voltage $V_{PP}$. However, in this embodiment, the reference voltage $V_{Ref}$ is derived by subtracting the absolute value of the threshold voltage $|V_{tp}|$ from the bandgap voltage $V_{bg}$, rather than from the applied voltage $V_{DD}$, so that the back-bias voltage $V_{PP}$ is independent of the applied voltage $V_{DD}$. Of course, embodiments based on either the applied voltage $V_{DD}$ or the bandgap voltage $V_{bg}$ are both capable of advantageously regulating back-bias voltage $V_{PP}/V_{BB}$ in response to both process and temperature variations by employing a reference voltage signal that varies correspondingly with the process and/or temperature variations.

While various embodiments of reference voltage generator circuits, and methods for generating and regulating reference voltages, according to the principles disclosed herein have been described above, it should be understood that they have been presented by way of example only, and not limitation. Thus, the breadth and scope of the invention (s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A back-bias voltage regulator circuit for regulating a back-bias voltage used to control leakage current in at least one transistor within a primary circuit, the back-bias voltage regulator circuit comprising:
  a voltage divider circuit configured to receive a back-bias voltage from a charge pump, and to generate a divided voltage signal by dividing the back-bias voltage based on a ratio of resistances of resistive elements within the voltage divider;
  an output circuit configured to receive the back-bias voltage from the charge pump and having an output node for outputting the back-bias voltage;
  a reference voltage circuit configured to generate a reference voltage signal based on a threshold voltage of the at least one transistor in the primary circuit; and
  a comparison circuit configured to compare the divided voltage signal to the reference voltage signal and to operate the output circuit to regulate the back-bias voltage level based on the comparison.

2. A back-bias voltage regulator circuit according to claim 1, wherein the output circuit comprises at least one NMOS transistor, the comparison circuit configured to increase a current across the at least one NMOS transistor to decrease the back-bias voltage.

3. A back-bias voltage regulator circuit according to claim 2, wherein the comparison circuit comprises a differential amplifier configured to receive the divided voltage signal at a non-inverting input and the reference voltage signal at an inverting input.

4. A back-bias voltage regulator circuit according to claim 2, wherein the reference voltage signal is further based on a difference between the threshold voltage and a supply voltage applied to the charge pump and reference voltage circuit.

5. A back-bias voltage regulator circuit according to claim 2, wherein the reference voltage signal is further based on a difference between the threshold voltage and a band-gap voltage of the at least one transistor in the primary circuit.

6. A back-bias voltage regulator circuit according to claim 2, wherein the back-bias voltage is greater than zero.

7. A back-bias voltage regulator circuit according to claim 1, wherein the output circuit comprises at least one PMOS transistor, the comparison circuit configured to decrease a current across the at least one PMOS transistor to increase the back-bias voltage.

8. A back-bias voltage regulator circuit according to claim 5, wherein the comparison circuit comprises a differential amplifier configured to receive the divided voltage signal at an inverting input and the reference voltage signal at a non-inverting input.

9. A back-bias voltage regulator circuit according to claim 5, wherein the reference voltage signal is further based on a difference between the threshold voltage and a supply voltage applied to the charge pump, the reference voltage circuit, the output circuit, and the voltage divider circuit.

10. A back-bias voltage regulator circuit according to claim 5, wherein the reference voltage signal is further based on a difference between the threshold voltage and a band-gap voltage of the at least one transistor in the primary circuit.

11. A back-bias voltage regulator circuit according to claim 5, wherein the back-bias voltage is less than zero.

12. A method of regulating back-bias voltage to control leakage current in at least one transistor within a primary circuit, the method comprising:
generating a divided voltage signal by dividing a back-bias voltage received from a charge pump by a ratio of resistances of resistive elements arranged in voltage divider circuit;
generating a reference voltage signal based on a threshold voltage of the at least one transistor in the primary circuit;
comparing the divided voltage signal to the reference voltage signal; and
operating an output circuit configured to receive the back-bias voltage in order to regulate the back-bias voltage level based on the comparing.

13. A method according to claim 12, wherein the output circuit comprises at least one NMOS transistor, the operating further comprising increasing a current across the at least one NMOS transistor to decrease the back-bias voltage.

14. A method according to claim 13, wherein the comparing is provided by a differential amplifier configured to receive the divided voltage signal at a non-inverting input and the reference voltage signal at an inverting input.

15. A method according to claim 13, wherein generating a reference voltage signal further comprises generating a reference voltage signal further based on a difference between the threshold voltage and a supply voltage applied to the charge pump.

16. A method according to claim 13, wherein generating a reference voltage signal further comprises generating a reference voltage signal further based on a difference between the threshold voltage and a band-gap voltage of the at least one transistor in the primary circuit.

17. A method according to claim 13, wherein the back-bias voltage is greater than zero.

18. A method according to claim 12, wherein the output circuit comprises at least one PMOS transistor, the operating further comprising decreasing a current across the at least one PMOS transistor to increase the back-bias voltage.

19. A method according to claim 18, wherein the comparing is provided by a differential amplifier configured to receive the divided voltage signal at an inverting input and the reference voltage signal at a non-inverting input.

20. A method according to claim 18, wherein generating a reference voltage signal further comprises generating a reference voltage signal further based on a difference between the threshold voltage and a supply voltage applied to the charge pump.

21. A method according to claim 18, wherein generating a reference voltage signal further comprises generating a reference voltage signal further based on a difference between the threshold voltage and a band-gap voltage of the at least one transistor in the primary circuit.

22. A method according to claim 18, wherein the back-bias voltage is less than zero.

* * * * *